United States Patent [19]
Roof

[11] Patent Number: 5,173,848
[45] Date of Patent: Dec. 22, 1992

[54] MOTOR CONTROLLER WITH BI-MODAL TURNOFF CIRCUITS

[76] Inventor: Richard W. Roof, 1073 Three Chop Run, Lexington, S.C. 29072

[21] Appl. No.: 755,727

[22] Filed: Sep. 6, 1991

[51] Int. Cl.$^5$ .......................................... H02H 7/122
[52] U.S. Cl. ........................................ 363/56; 363/98
[58] Field of Search .................... 363/37, 56, 98, 132, 363/91, 94, 101

[56] References Cited

U.S. PATENT DOCUMENTS

| | | | |
|---|---|---|---|
| 4,528,494 | 7/1985 | Bloomer | 323/237 |
| 4,543,522 | 9/1985 | Moreau | 323/303 |
| 4,639,616 | 1/1987 | Gaude | 307/270 |
| 4,672,524 | 6/1987 | Toriyama et al. | 363/56 |
| 4,680,664 | 7/1987 | Leuthen | 363/56 |
| 4,697,218 | 9/1987 | Nicolas | 361/87 |
| 4,771,357 | 9/1988 | Lorincz et al. | 361/87 |
| 4,792,747 | 12/1988 | Schroeder | 323/303 |
| 4,827,366 | 5/1989 | McNally | 361/18 |
| 4,864,214 | 9/1989 | Billings | 323/289 |
| 4,885,447 | 12/1989 | Gonzalez | 363/132 |
| 4,891,728 | 1/1990 | Preis et al. | 361/18 |
| 4,912,622 | 3/1990 | Steigerwald et al. | 363/98 |
| 4,965,710 | 10/1990 | Pelly et al. | 363/132 |
| 4,970,620 | 11/1990 | Lehnhoff et al. | 363/56 |
| 4,989,127 | 1/1991 | Wegener | 363/98 |
| 4,998,054 | 3/1991 | Bose et al. | 363/132 |
| 5,063,338 | 11/1991 | Capel et al. | 363/56 |
| 5,063,490 | 11/1991 | Maehara et al. | 363/37 |

OTHER PUBLICATIONS

Gate Driver Hybrid IC Specification (Tentative).
Drive Circuit of MBT (IGBT), Fuji Electric Co., Ltd. Sep. 15, 1986.
EXB721 (Preliminary Specification), Fuji Electric Co., Ltd. Sep. 15, 1986.

Primary Examiner—Steven L. Stephan
Assistant Examiner—Jeffrey Sterrett
Attorney, Agent, or Firm—David Russell Stacey; Hugh M. Gilroy

[57] ABSTRACT

The motor controller of the present invention includes a power bus, an insulated gate bipolar power transistor and a control circuit. The direct current power bus provided a source and sink of current to be conducted to and from a controller motor. The insulated gate bipolar power transistor selectively conducts transistor current to and from the motor. The control circuit among other things determines power gate timing of the power transistor and the manner in which the insulated gate bipolar transistor conducts and ceases to conduct transistor current to or from the motor. The control circuitry includes a current bias circuit for selectively supplying a turn on voltage and turn off voltage to the power transistor, a slow resistor connects the bias circuit turn off voltage to the power gate of the power transistor to cause the power transistor to slowly cease conducting, a switchable FET for selectively conducting the bias circuit turn off voltage to the power gate through a fast mode circuit which bypasses the slow resistor, and a sensing selection circuit for sensing whether the power transistor is conducting transistor current at a normal level and if the transistor current is normal causing the switchable FET to conduct the turn off voltage and turn off the power gate through the fast mode circuit bypassing the slow resistor.

11 Claims, 1 Drawing Sheet

MOTOR CONTROLLER WITH BI-MODAL TURNOFF CIRCUITS

BACKGROUND OF THE INVENTION

It has been recognized virtually from the beginning of studies of electrical phenomenon that electrical components can be destroyed by over current or overvoltage conditions and a variety of prophylactic measures have been taken to ameliorate or to avoid damage to electrical components since their first use. One cause of an overvoltage condition is a rapid rate of changing the magnitude of current because of inductive affects being present in the circuit in which the current magnitude is being changed (overshoot overvoltage).

The motor controller of the present invention is a pulse width modulated controller for adjusting the amount and frequency of power provided to a motor. Motor controllers and pulse width modulated motor controllers, as such, are also known. The present invention includes a way of detecting a fault condition in the controller or the motor and avoid attempts to rapidly change the current level which would result in an overshoot overvoltage fault. A number of schemes are known which attempt to or do reduce the likelihood of overvoltage conditions under varying circumstances.

Among publications describing aspects of such generally known, or related, schemes are the following patents:

U.S. Pat. No. 4,528,494 issued to Bloomer on Jul. 9, 1985 for a REVERSE-PHASE-CONTROL POWER SWITCHING CIRCUIT AND METHOD.

U.S. Pat. No. 4,543,522 issued to Moreau on Sep. 24, 1985 for a REGULATOR WITH A LOW DROPOUT VOLTAGE.

U.S. Pat. No. 4,639,616 issued to Gaude on Jan. 27, 1987 for a CIRCUIT FOR CONTROLLING THE BASE OF A POWER TRANSISTOR USED IN HIGH TENSION SWITCHING.

U.S. Pat. No. 4,697,218 issued to Nicolas on Sep. 29, 1987 for an OVERCURRENT PROTECTION DEVICE.

U.S. Pat. No. 4,771,357 issued to Lorincz et al on Sep. 13, 1988 for a POWER DRIVER HAVING SHORT CIRCUIT PROTECTION.

U.S. Pat. No. 4,792,747 issued to Schroeder on Dec. 20, 1988 for a LOW VOLTAGE DROPOUT REGULATOR.

U.S. Pat. No. 4,827,366 issued to McNally et al on May 2, 1989 for a BI-POLAR POWER SUPPLY REGULATOR BI-POLAR POWER SUPPLY REGULATOR.

U.S. Pat. No. 4,864,214 issued to Billings et al on Sep. 5, 1989 for SOLID STATE POWER CONTROLLER.

U.S. Pat. No. 4,891,728 issued to Preis et al on Jan. 2, 1990 for a CIRCUIT ARRANGEMENT FOR LIMITING THE SWITCH-ON CURRENT AND FOR PROVIDING AN OVER VOLTAGE PROTECTION IN SWITCH MODE POWER SUPPLY DEVICES.

It is believed that Fuji Electric Company may have placed a protective device under their model no. EXB-721 IGBT into the public domain more than one year before the filing of this application.

The motor controller of the present invention is believed to reliably function over the entire range of potential fault conditions experienced by the motor controller.

SUMMARY OF THE INVENTION

The motor controller of the present invention includes a power bus, an insulated gate bipolar power transistor and a control circuit. The direct current power bus provides a source and sink of current to be conducted to and from a controlled motor. The insulated gate bipolar power transistor selectively conducts transistor current to and from the motor. The control circuit among other things determines power gate timing of the power transistor and the manner in which the insulated gate bipolar transistor conducts and ceases to conduct transistor current to or from the motor. The control circuitry includes bias means for selectively supplying a turn on voltage and turn off voltage to the power transistor, slow isolation means connecting the bias means turn off voltage to power gate of the power transistor to cause the power transistor to slowly cease conducting, a switchable conduction means for selectively conducting the bias means turn-off voltage to the power gate through a fast mode circuit which bypasses the slow isolation means, and sensing selection means for sensing whether the power transistor is conducting transistor current at a normal level and if the transistor current is normal causing the switchable conduction means to turn off the power gate through the fast mode circuit.

DETAILED DESCRIPTION OF THE DRAWING

Figure 1:
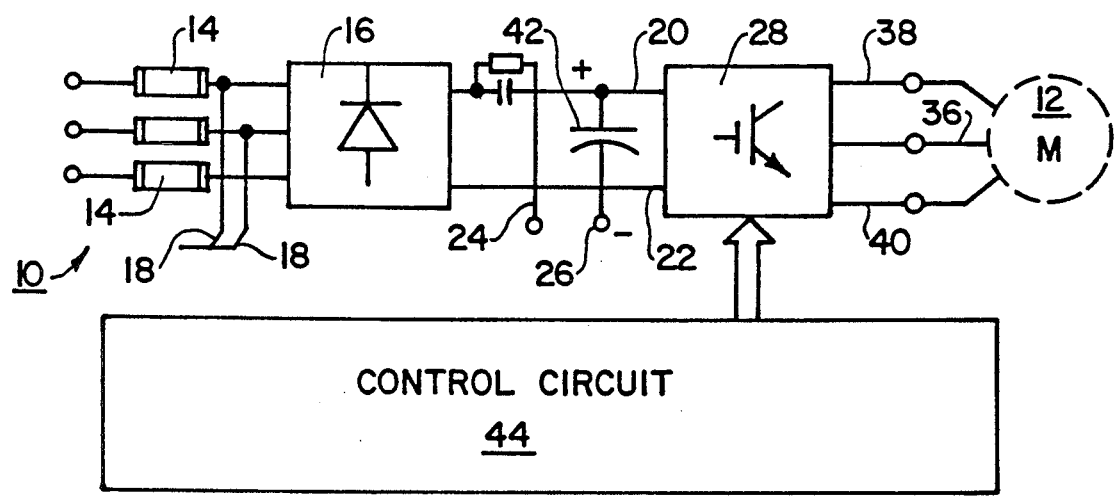
FIG. 1 is a block diagram of the motor controller of the present motor controller invention.

FIG. 1 illustrates a block diagram of the three phase motor controller 10 of the present invention connected to a motor 12 to be controlled. Controller 10 includes a protective fuse 14 for each leg of the three phase alternating current supply leading to rectifier 16. Alternating current leads 18 between fuses 14 and rectifier 16 supply power to other portions of controller 10 in a conventional manner. Rectifier 16 converts the alternating current supply to direct current which is supplied to a power bus having a positive bus 20 and a negative bus 22. Auxiliary dc positive bus lead 24 and negative lead 26 provide dc bus power to auxiliary functions of the motor controller 10. Positive and negative buses 20,22 supply power to power switching circuit 28 in motor controller 10. Power switching circuit 28 includes three power poles 30 schematically illustrated in FIG. 2. Each power pole 30 includes a pair of power transistors 32,34 which are preferably insulated gate bipolar transistors. Power transistor 32 has its power collector 33 connected to positive bus 20 and its power emitter 35 connected to phase conductor 36. Insulated gate bipolar transistor 34 has its power collector 37 connected to phase conductor 36 and its power emitter 39 connected to negative bus 22. The remaining two power poles are similarly connected to the buses 20, 22 and phase leads 38, 40. One of the pair of power transistors 32, 34 in a power pole has its collector connected to bus 20 and its emitter to one phase lead 38,40. The other of the pair of power transistors has its collector connected to the same phase lead and its emitter connected to bus 22. A dc bus clamp capacitor 42 is interposed between rectifier 16 and power switching circuit 28 to clamp the bus voltage should the motor 12 enter a regenerative stage. Control circuit 44 provides signals determining when power poles 30 conduct current to and from motor 12 through individual power transistors 32,34 while protecting controller 10 against overshoot overvoltage and other overvoltages under a wide range of conditions. The timing of gate signals sent to a power gate 46 of any of the power transistors 32,34 determines when transistor current conducted by a power transistor is conducted to and from motor 12 in a manner to successfully accomplish pulse width modulation of motor. The pulse width modulation method of motor control is generally known (e.g. *Standard Handbook for Electrical Engineers*, Editor-Fink, Donald G., McGraw-Hill-1978 incorporated with references by this reference). However, the generally previously known schemes lacked an ability to protect the output of a motor controller against overshoot overvoltage under some conditions.

Figure 2:
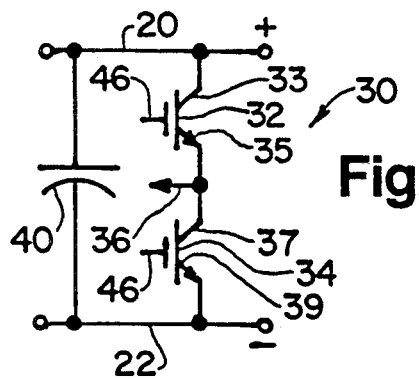
FIG. 2 is a schematic of a portion of the motor controller illustrated in FIG. 1 showing a single power pole.
Figure 3:
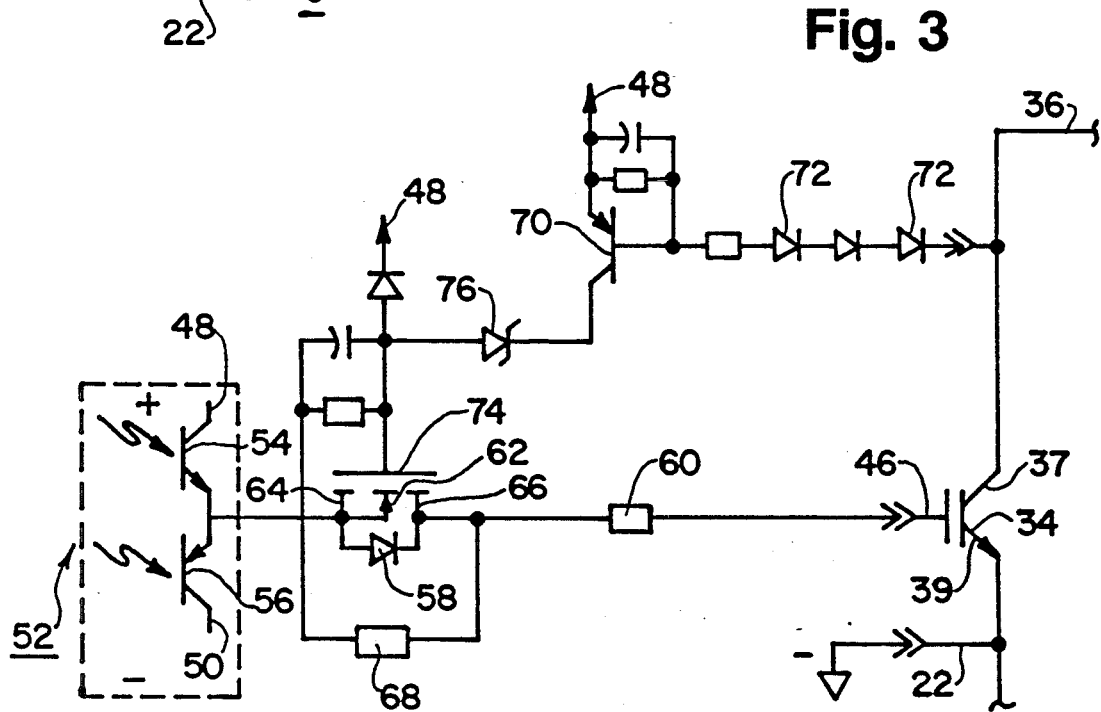
FIG. 3 is a schematic incorporating portions of the power pole shown in FIG. 2 and the control circuit shown in FIG. 1.

FIG. 3 combines components from FIGS. 1 and 2 to illustrate the overshoot overvoltage protection scheme of the present invention. Power transistor 34 from one power pole 30 is shown and is sufficient to allow one skilled in the art to understand the protection scheme. Control circuit 44 includes positive and negative signal buses 48,50 at about fifteen volts. Optically isolated gate driver 52 including a positive driver transistor 54 connected to positive signal bus 48 and negative driver transistor 56 connected to negative signal bus 50 are the source of power gate turn on and turn off voltages provided to power gate 46. Each driver transistor 54, 56 responds to its optical gating signal in response to various algorithms and sensed conditions. Gate driver 52 can be an integrated package such as that furnished by a Toshiba TF1206. If positive driver 54 is gated on, turn on voltage is rapidly conducted through fast diode 58 and a fast resistor 60. The resistance value of fast resistor 60 is about 16 ohm and should be selected to cause a fast transition between conducting and non conducting states of power transistors 32, 34. Together fast diode 58 and fast resistor 60 serve as fast conduction means for connecting said bias means turn on voltage to said power gate so that said power transistors 32, 34 rapidly begins conducting transistor current. Fast diode 58 is shunted by switching field effect transistor (FET) 62 by source 64 and drain 66 terminals. Slow resistor 68 is also in a shunting relationship with both switching transistor 62 and fast diode 58. A value of about 47 ohms for slow resistor 68 is appropriate to sufficiently slow the transition from the conducting state to the non conducting state of power transistor 32, 34 to avoid inductive voltage overshoot for 20 H.P. and 40 H. P. frame motors. Slow resistor 68 serves as slow isolation means for conducting the turn off voltage to power gate 46 to cause a relatively slow transition from the conducting state to the non conducting state of power transistor 32, 34 if switching transistor 62 is not conducting. Slow resistor 68 is always in the conduction path between negative driver transistor 56 and power gate 46 for the turn off voltage unless switching transistor 62 is conducting. As power transistor 32, 34 is gated on by the turn on voltage as previously described, the collector 37 voltage drops to several volts. Sensing transistor 70 is switched on through sensing diodes 72 as long as the collector 37 voltage remains in the several volt range and applies a positive voltage to switching gate 74 through a 15 volt Zener diode 76 when a turn off voltage is present so that switching transistor 62 conducts the turn off voltage bypassing slow resistor 68. If the transistor current through a power transistor 32, 34 becomes excessive, power transistor 32, 34 will come out of saturation and the voltage on collector 37 will rise. When the string of sensing diodes 72 become reversed biased with the rise in collector 37 voltage, sensing transistor 70 is switched off and switching transistor 62 also ceases conduction. Since switching transistor 62 no longer shunts slow resistor 68, turn off voltage is applied through both resistors 68, 60 to cause a relatively slow transistion from the conducting to the non conducting state of power transistors 32, 34 and avoid the overshoot overvoltage caused by an over current value of transistor current. Switching transistor 70 with associated sensing diodes 72 serve as sensing selector means for sensing whether the power transistor 32, 34 is conducting a transistor current at a normal level and if the transistor current is at a normal level causing switching transistor 62 to connect the bias means turn off voltage to power gate 46 through a fast mode circuit including switching transistor 62 and fast resistor 60 so that power transistor 32, 34 rapidly ceases conducting. Other solid state sensing switches could be used in place of sensing transistor 70. The degree to which power transistor 32, 34 can come out of saturation before sensing transistor 70 is switched off may be varied by the number of sensing diodes 72. Sensing transistor 70 although responsive to power transistor 32, 34 voltage serves as a sensing selection means for sensing whether said power transistor is conducting a transistor current at a normal level.

As those skilled in the art will readily recognize, some of the invention elements may be interchanged, for example those shown as integral may be separated or those separated may be made integral without adversely affecting the performance of the invention.

From the foregoing description it will be apparent that modifications can be made to the motor controller of the present invention without departing from the teaching of the invention. Also it will be appreciated that the invention has a number of advantages, some of which have been described above and others of which are inherent in the invention. Accordingly, the scope of the invention is only to be limited as is necessitated by the accompanying claims.

I claim:

1. A motor controller with bi-modal turn off circuits for controlling a motor comprising:
   a direct current power bus providing a source of current to be conducted to said motor;
   an insulated gate bipolar power transistor selectively conducting transistor current, said transistor having a power gate, and a power emitter terminal, and a power collector terminal operatively connected to said bus and said motor for either conducting transistor current to said motor or from said motor;
   a control circuit including;
   bias means for selectively supplying a turn on voltage and a turn off voltage to said power transistor;
   slow isolation means for connecting said bias means turn off voltage to said power gate to cause said power transistor to slowly cease conducting;

a fast mode circuit switchable to bypass said slow isolation means; including switchable conduction means for selectively connecting said bias means turn off voltage to said power gate through said fast mode circuit shunting said slow isolation means; and sensing selection means for sensing whether said power transistor is conducting a transistor current at a normal level by responding to a change in transistor voltage if said transistor current is abnormally high which drives said power transistor out of saturation and rises said transistor voltage and if the transistor current is at a normal level causing said switchable conduction means to connect said bias means turn off voltage to said power gate through said fast mode circuit so that said power transistor rapidly ceases conducting, said sensing selection means includes a solid state sensing switch operatively connected to a terminal of said power transistor and to a source which can activate said switchable conduction means, said sensing switch activated only if said power transistor is in a conducting state and not driven out of a saturation condition by fault levels of transistor current, said solid state sensing switch is a transistor which is connected to said power transistor through a plurality of sensing diodes, the number of sensing diodes determining the degree that said power transistor may depart from a saturation condition before said switchable conduction means is deactivated.

2. A motor controller with bi-modal turn off circuits for controlling a motor comprising:

a direct current power bus providing a source of current to be conducted to said motor;

an insulated gate bipolar power transistor selectively conducting transistor current, said transistor having a power gate, and a power emitter terminal, and a power collector terminal operatively connected to said bus and said motor for either conducting transistor current to said motor or from said motor;

a control circuit including;

bias means for selectively supplying a turn on voltage and a turn off voltage to said power transistor;

slow isolation means for connecting said bias means turn off voltage to said power gate to cause said power transistor to slowly cease conducting;

a fast mode circuit switchable to bypass said slow isolation means; including switchable conduction means for selectively connecting said bias means turn off voltage to said power gate through said fast mode circuit shunting said slow isolation means; and sensing selection means for sensing whether said power transistor is conducting a transistor current at a normal level by responding to a change in transistor voltage if said transistor current is abnormally high which drives said power transistor out of saturation and rises said transistor voltage and if the transistor current is at a normal level causing said switchable conduction means to connect said bias means turn off voltage to said power gate through said fast mode circuit so that said power transistor rapidly ceases conducting.

3. A motor controller with bi-modal turn off circuits for controlling a motor comprising:

a direct current power bus providing a source of current to be conducted to said motor;

an insulated gate bipolar power transistor selectively conducting transistor current, said transistor having a power gate, and a power emitter terminal, and a power collector terminal operatively connected to said bus and said motor for either conducting transistor current to said motor or from said motor;

a control circuit including;

bias means for selectively supplying a turn on voltage and a turn off voltage to said power transistor;

slow isolation means for connecting said bias means turn off voltage to said power gate to cause said power transistor to slowly cease conducting, said slow isolation means is a slow resistor of a value sufficient to slow the cessation of conduction of said power transistor by about a factor of fifteen from the rate of cessation of conduction which occurs when the switchable conduction means causes the bias means to be connected through said fast mode circuit to said power gate;

a fast mode circuit switchable to bypass said slow isolation means; including switchable conduction means for selectively connecting said bias means turn off voltage to said power gate through said fast mode circuit shunting said slow isolation means; and sensing selection means for sensing whether said power transistor is conducting a transistor current at a normal level and if the transistor current is at a normal level causing said switchable conduction means to connect said bias means turn off voltage to said power gate through said fast mode circuit so that said power transistor rapidly ceases conducting.

4. The motor controller of claim 3 wherein said switchable conduction means is a field effect transistor substantially in parallel to said slow isolation means and said switchable conduction means includes said fast conduction means.

5. The motor controller of claim 4 wherein said fast conduction means is a diode forward biased by said turn on voltage.

6. A motor controller with bi-modal turn off circuits for controlling a motor comprising:

a direct current power bus providing a source of current to be conducted to said motor;

an insulated gate bipolar power transistor selectively conducting transistor current, said transistor having a power gate, and a power emitter terminal, and a power collector terminal operatively connected to said bus and said motor for either conducting transistor current to said motor or from said motor;

a control circuit including;

bias means for selectively supplying a turn on voltage and a turn off voltage to said power transistor;

slow isolation means for connecting said bias means turn off voltage to said power gate to cause said power transistor to slowly cease conducting;

a fast mode circuit switchable to bypass said slow isolation means; including switchable conduction means for selectively connecting said bias means turn off voltage to said power gate through said fast mode circuit shunting said slow isolation means; and sensing selection means for sensing whether said power transistor is conducting a transistor current at a normal level and if the transistor current is at a normal level causing said switchable conduction means to connect said bias means turn off voltage to said power gate through said fast mode circuit so that said power transistor rapidly ceases conducting, said sensing selection means includes a solid state sensing switch operatively connected to a terminal of said power transistor and to a source which can activate said switchable conduction means, said sensing switch activated only if said power transistor is in a conducting state and not driven out of a saturation condition by fault levels of transistor current, said solid state sensing switch is a transistor which is connected to said power transistor through a plurality of sensing diodes, the number of sensing diodes determining the degree that said power transistor may depart from a saturation condition before said switchable conduction means is deactivated.

7. A motor controller with bi-modal turn off circuits for controlling a motor comprising:
 a direct current power bus providing a source of current to be conducted to said motor;
 an insulated gate bipolar power transistor selectively conducting transistor current, said transistor having a power gate, and a power emitter terminal, and a power collector terminal operatively connected to said bus and said motor for either conducting transistor current to said motor or from said motor;
 a control circuit including;
 bias means for selectively supplying a turn on voltage and a turn off voltage to said power transistor;
 slow isolation means for connecting said bias means turn off voltage to said power gate to cause said power transistor to slowly cease conducting;
 a fast mode circuit switchable to bypass said slow isolation means; including switchable conduction means for selectively connecting said bias means turn off voltage to said power gate through said fast mode circuit shunting said slow isolation means; and
 sensing selection means for sensing whether said power transistor is conducting a transistor current at a normal level and if the transistor current is at a normal level causing said switchable conduction means to connect said bias means turn off voltage to said power gate through said fast mode circuit so that said power transistor rapidly ceases conducting.

8. The motor controller of claim 7 wherein said bias means includes a pair of opposite polarity transistors operatively connected in a push pull configuration between signal level busses of opposite polarity.

9. The motor controller of claim 7 wherein said control circuitry means further includes fast conduction means for connecting said bias means turn on voltage to said power gate so that said power transistor rapidly begins conducting transistor current.

10. The motor controller of claim 7 wherein said sensing selection means includes a solid state sensing switch operatively connected to a terminal of said power transistor and to a source which can activate said switchable conduction means, said sensing switch activated only if said power transistor is in a conducting state and not driven out of a saturation condition by fault levels of transistor current.

11. The controller of claim 7 wherein said bi-modal turn off circuit includes a driver transistor connected to a driver bus;
 a slow resistor in selective series with said driver transistor;
 a switching transistor shunting said slow resistor; and
 a fast resistor in series with a base of said insulated gate bipolar power transistor and in selective series with said slow resistor and said switching transistor.

* * * * *